United States Patent
Steinmann et al.

(10) Patent No.: US 6,737,326 B2
(45) Date of Patent: May 18, 2004

(54) METHOD OF INTEGRATING A THIN FILM RESISTOR IN A MULTI-LEVEL METAL TUNGSTEN-PLUG INTERCONNECT

(75) Inventors: Philipp Steinmann, Munich (DE); Stuart M. Jacobsen, Frisco, TX (US); Louis N. Hutter, Plano, TX (US); Fred D. Bailey, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/852,921

(22) Filed: May 10, 2001

(65) Prior Publication Data

US 2001/0049199 A1 Dec. 6, 2001

Related U.S. Application Data

(60) Provisional application No. 60/208,705, filed on Jun. 1, 2000.

(51) Int. Cl.[7] .............................................. H01L 21/20
(52) U.S. Cl. ....................... 438/381; 438/720; 438/722; 438/384
(58) Field of Search .................... 438/238–240, 438/380–384, 329, 330, 720, 722, 754, 756

(56) References Cited

U.S. PATENT DOCUMENTS

| | | | | |
|---|---|---|---|---|
| 5,420,063 A | * | 5/1995 | Maghsoudnia et al. | 437/60 |
| 5,422,307 A | * | 6/1995 | Ishii | 437/184 |
| 5,485,138 A | * | 1/1996 | Morris | 338/306 |
| 5,547,896 A | * | 8/1996 | Linn et al. | 437/60 |
| 6,165,862 A | * | 12/2000 | Ishikawa et al. | 438/384 |
| 6,326,256 B1 | * | 12/2001 | Bailey et al. | 438/238 |

* cited by examiner

*Primary Examiner*—Robert Kunemund
*Assistant Examiner*—Duy-Vu Deo
(74) *Attorney, Agent, or Firm*—Jacqueline J. Garner; W. James Brady, III; Frederick J. Telecky, Jr.

(57) ABSTRACT

A method for integrating a thin film resistor into an interconnect process flow where one of the metal layers is used as a hardmask. After a via (42) etch and fill, the thin film resistor material (62) is deposited. The metal interconnect layer (76) is then deposited, including any barrier layers desired. The metal leads (70) are then etched together with the shape of the thin film resistor (60). The metal (76) over the thin film resistor (60) is then removed.

13 Claims, 3 Drawing Sheets

METHOD OF INTEGRATING A THIN FILM RESISTOR IN A MULTI-LEVEL METAL TUNGSTEN-PLUG INTERCONNECT

This application claims priority under 35 USC §119(e)(1) of provisional application No. 60/208,705 filed Jun. 1, 2000.

FIELD OF THE INVENTION

The invention is generally related to the field of thin film resistors in integrated circuits and more specifically to a solution for integrating a thin film resistor into a multi-level metal tungsten-plug interconnect.

BACKGROUND OF THE INVENTION

Thin film resistors are utilized in electronic circuits in many important technological applications. The resistors may be part of an individual device, or may be part of a complex hybrid circuit or integrated circuit. Some specific examples of thin film resistors in integrated circuits are the resistive ladder network in an analog-to-digital converter, and current limiting and load resistors in emitter follower amplifiers.

Film resistors can comprise a variety of materials including tantalum nitride (TaN), silicon chromium (SiCr), and nickel chromium (NiCr). These resistor materials are generally evaporated or sputtered onto a substrate wafer at a metal interconnect level and subsequently patterned and etched. The thin film resistors require an electrical connection to be made to them. Thus, two mask layers are required. One, TFRES, is to form the resistor itself and the other, TFHEAD, is used to form the resistor "heads" or contact points of the resistor. Connection is made from an overlying metal interconnect layer to the resistor heads. The resistor heads are required to protect the resistor during the via etch needed to make contact between the overlying metal interconnect layer and the resistor. In addition to two masks, multiple deposition and dry/wet etch steps are required to incorporate the resistor.

Morris (U.S. Pat. No. 5,485,138, issued Jan. 16, 1996) describes a method of forming an inverted thin film resistor. The resistor structure is deposited directly on top of the metallic interconnects. The metallic interconnects are formed. An interlevel dielectric layer is deposited over the metallic interconnects and polished back to expose the top surface of the metallic interconnects. The resistor is then formed on a portion of the interlevel dielectric and a portion of the metallic interconnect.

SUMMARY OF THE INVENTION

The invention is a method for integrating a thin film resistor into an interconnect process flow where one of the metal layers is used as a hardmask. After a via etch and fill, the thin film resistor material is deposited. The metal interconnect layer is then deposited, including any barrier layers desired. The metal leads are then etched together with the shape of the thin film resistor. The metal over the thin film resistor is then removed.

An advantage of the invention is providing a method of incorporating an thin film resistor in which only one additional mask step is required to incorporate the resistor.

This and other advantages will be apparent to those of ordinary skill in the art having reference to the specification in conjunction with the drawings.

DETAILED DESCRIPTION OF THE EMBODIMENTS

The following description of the preferred embodiment is merely exemplary in nature and is in no way intended to limit the invention or its application or uses. The present invention discloses a process for manufacturing a thin film resistor in an integrated circuit using a single additional mask.

Figure 1:
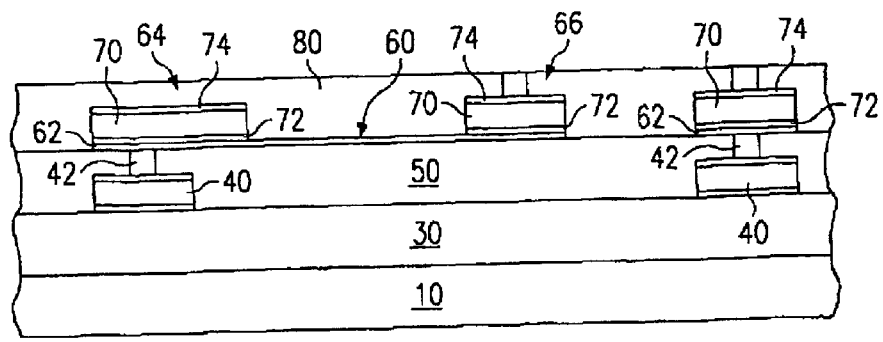
FIG. 1 is a cross-sectional diagram of an integrated circuit having a thin film resistor according to the invention.

A thin film resistor 60 according to the invention is shown in FIG. 1. A first dielectric layer 30 is formed over a semiconductor body 10. Semiconductor body 10 may, for example, comprise a silicon substrate with transistors and other devices formed thereon. Semiconductor body 10 may also include an isolation structure such as field oxide or shallow trench isolation. Thin film resistors are typically formed over the isolation regions of a semiconductor body in order to allow laser trimming of the resistor.

Metal interconnect lines 40 are located over first dielectric layer 30. Metal interconnect lines 40 is shown as the second metal interconnect level, but may be part of the first or any subsequent metal interconnect layer except the upper most metal interconnect layer. Metal interconnect lines 40 may, for example, comprise aluminum with appropriate barrier layers. However, other suitable metals are known in the art.

Metal interconnect lines 40 are located within an interlevel dielectric (ILD) 50. ILD 50 may, for example, comprise a spin-on-glass. Other suitable dielectrics, such as HSQ (hydrogen silsesquioxane) or FSG (fluorine doped silicate glass), as well as combinations of dielectrics (e.g., combinations of TEOS, HDP oxide, and/or PSG), are known in the art.

Vias 42 are also embedded within ILD 50. Vias 42 extend from the upper surface of ILD 50 to the upper surface of a metal interconnect line 40. Tungsten may be used to fill vias 42. Other suitable materials for filling vias 42 will be apparent to those of ordinary skill in the art.

Thin film resistor 60 is located on ILD 50 and preferably comprises nickel-chromium (NiCr). Other suitable thin film resistor materials are known in the art. For example, tantalum-nitride (TaN) or silicon chromium (SiCr) may alternatively be used. The thin film resistor material 62 is located not only in the thin film resistor 60 area, but under the metal lines 70 as well.

Metal lines 70 are shown as the third interconnect level and may comprise aluminum with appropriate upper and lower barrier layers 72 and 74, respectively. For example, Ti, TiN, Ta, TaN, and combinations thereof may be used for the upper and lower barrier layers 72 and 74. Portions of metal lines 70 serve as the resistor contacts 64 and 66.

Thin film resistor 60 and metal lines 70 are embedded within ILD 80. ILD 80 may be comprised of a spin on glass.

Other suitable materials for ILD 80 are well known in the art. For example, FSG, HSQ, or a combination of dielectrics (e.g., combinations of TEOS, HDP oxide, and/or PSG) may be used.

Figure 2A:
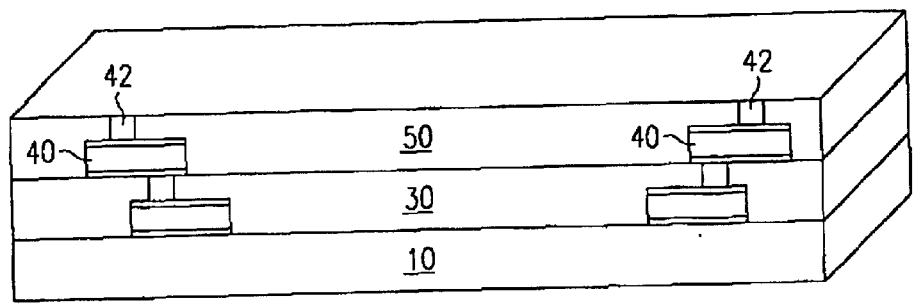
FIGS. 2A–2F are cross-sectional diagrams of the integrated circuit of FIG. 1 at various stages of fabrication.

A method for forming thin film resistor 60 according to the invention will now be discussed with reference to FIGS. 2A–2E. Referring to FIG. 2A, a semiconductor body 10. Semiconductor body 10 is typically a silicon substrate processed through the formation of isolation structures, transistors, and other devices (not shown). Deposited over semiconductor body 10 is a dielectric layer 30. Dielectric layer 30 may be a PMD (poly-metal dielectric) layer if lower metal interconnect lines 40 are part of the first metal interconnect layer, sometimes referred to as Metal-1. Alternatively, dielectric layer 30 may be an interlevel dielectric layer located between interconnect levels as shown in FIG. 2A. In this case, metal interconnect lines 40 are part of the second metal interconnect layer, sometimes referred to as METAL-2.

After the deposition, pattern, and etch to form metal interconnect lines 40, ILD 50 is formed. ILD 50 is preferably a planarized layer and may be formed in any of a number of ways. Some examples include: deposition followed by CMP (chemical-mechanical-polishing), resist etch back, deposition of a flowable oxide such as HSQ, dep-etch-dep, deposition of a spin-on-glass (SOG) and etchback. Dielectric 50 may be any planarized dielectric suitable for interlevel dielectric layers, such as SOG, BPSG (boron and phosphorous doped silicate glass), PSG (phosphorous doped silicate glass), USG (undoped silicate glass) and HSQ.

Still referring to FIG. 2A, vias 42 are etched in ILD 50 and filled with a conductive material such as tungsten. Vias 42 provide connection to various metal interconnect lines 40. The surface of vias 42 is planar with the surface of ILD 50.

Figure 2B:
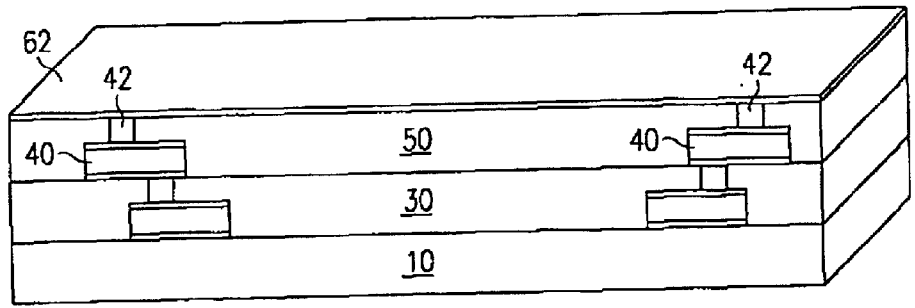

Referring to FIG. 2B, resistor material 62 is deposited over ILD 50 and vias 42. Resistor material 62 preferably comprises NiCr. Other suitable materials such as TaN and SiCr are known in the art. As an example, sputter deposition may be used. Resistor material 60 may be, for example, 50-2000 Å thick.

Figure 2C:
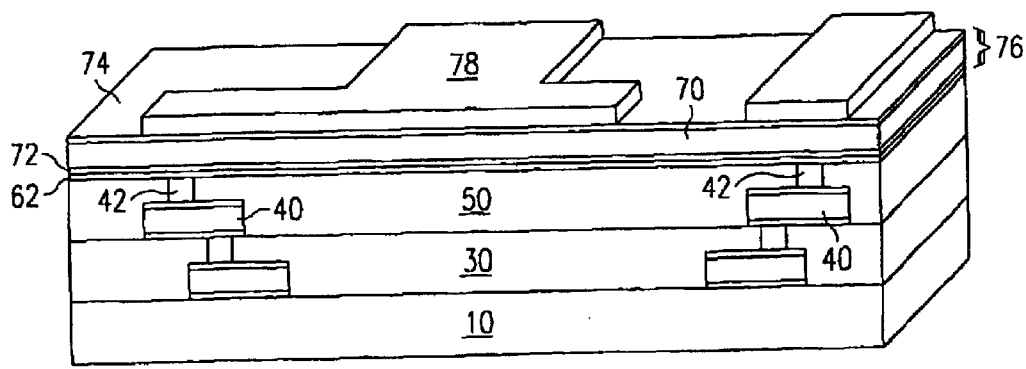
Figure 2D:
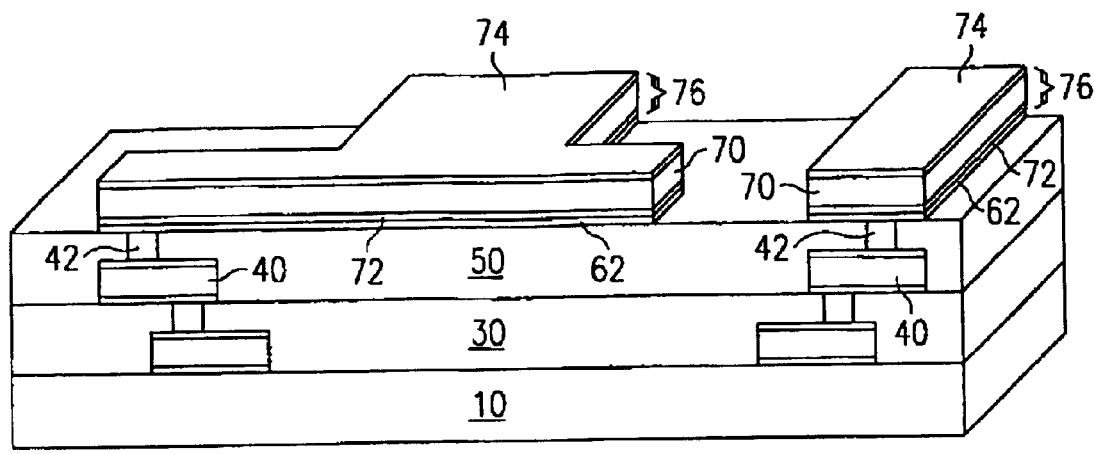

Metal stack 76 is deposited over resistor material 60, as shown in FIG. 2C. Metal stack 76 preferably includes upper and lower barrier layers 72 and 74. Barrier layers 72 and 74 may, for example, comprise Ti, TiN, Ta TaN, or combinations thereof. Metal layer 70 typically comprises aluminum.

Next, a photoresist mask 78 is formed over metal stack 76. The photoresist mask 78 covers those portions of metal stack 76 where metal lines 70 are desired as well as the areas that will become the thin film resistor. The exposed portions of metal stack 76 and resistor material 62 are then removed using a dry etch, for examples $BCl_3$, $Cl_2$. The photoresist mask 78 is then removed, resulting in the structure shown in FIG. 2D.

Figure 2E:
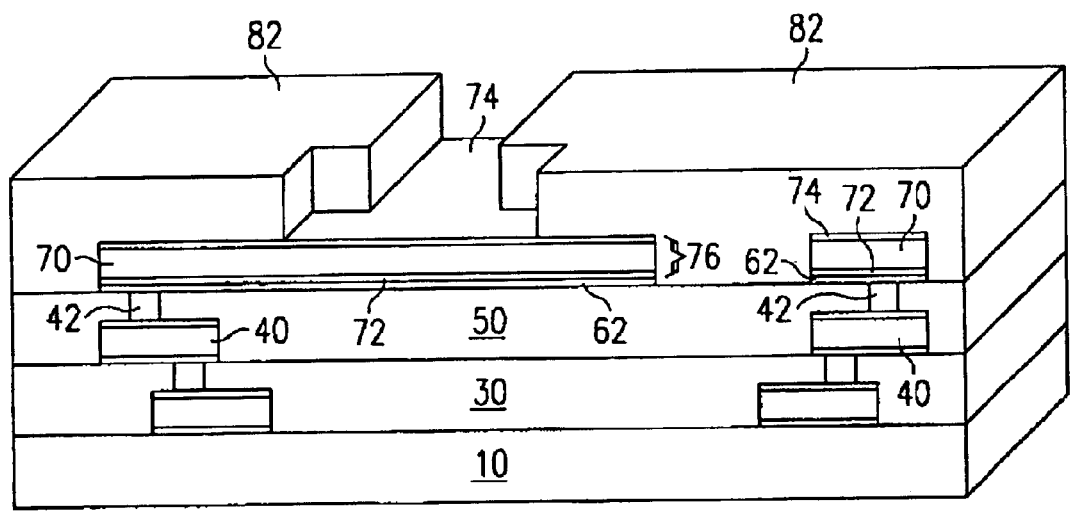
Figure 2F:
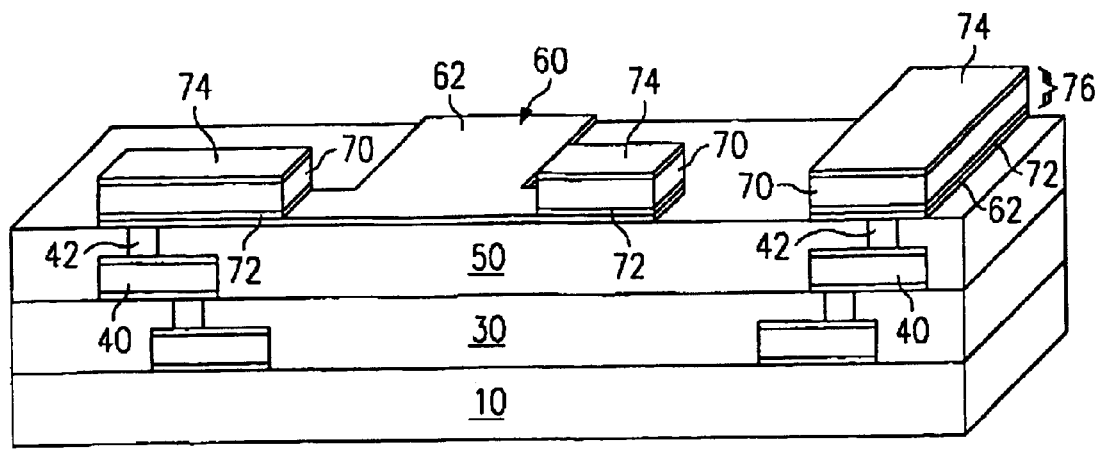

A second photoresist mask 82 is formed over ILD 50 and metal lines 70, as shown in FIG. 2E. Second photoresist mask 82 exposes the portion of metal stack 76 where thin film resistor 60 is desired. The exposed portion of metal stack 76 is then wet etched leaving thin film resistor 60. Photoresist mask 82 is removed. The resulting structure is shown in FIG. 2F.

The process then continues with the formation of ILD 80 and any desired subsequent metal interconnect levels.

A resistor is accordingly added to the interconnect process by adding only one deposition steps, one pattern step, and one etch step. The process is significantly simplified versus prior art approaches. Formation of resistor "heads", special vias, and split interlevel dielectrics are not required. Special resistor "heads" are not required as the same metal stack used to form a metal interconnect level is used to form connections to the thin film resistor. A special polishing step is not required.

Figure 3A:
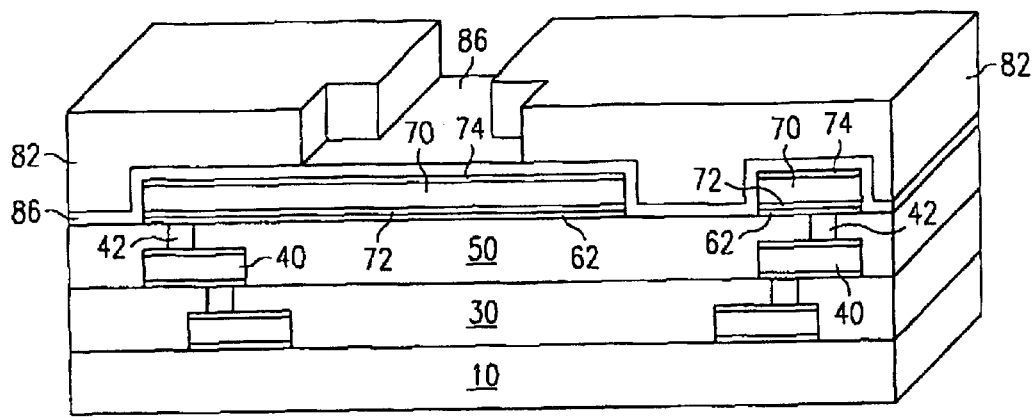
FIGS. 3A–3C are cross-sectional diagrams of a second embodiment of the invention at various stages of fabrication.
Figure 3B:
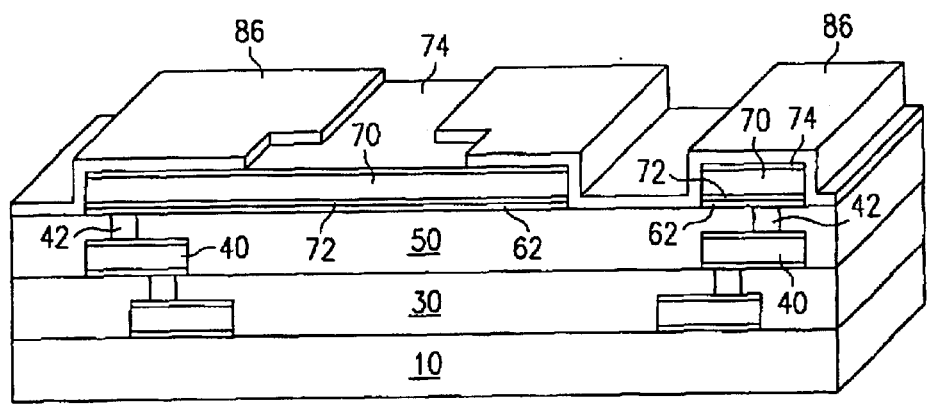

A second embodiment for forming thin film resistor 60 will now be discussed with reference to FIGS. 3A–3C. The semiconductor body 10 is processed as shown in the first embodiment through FIG. 2D. A hardmask 86 is deposited over the structure as shown in FIG. 3A. Hardmask 86 may, for example comprise silicon dioxide or silicon nitride. Other suitable examples will be apparent to those of ordinary skill in the art. The second photoresist mask 82 is then formed over hardmask 86. Referring to FIG. 3B, the exposed portion of hardmask 86 is removed using a selective wet etch. This is followed by the removal of photoresist mask 82.

Figure 3C:
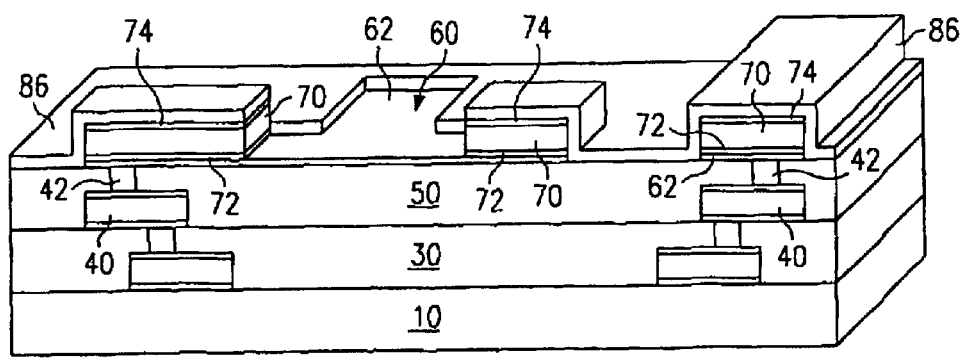

Using hardmask 86 as a mask, the exposed portions of metal stack 76 are removed as shown in FIG. 3C also using a wet etch. The second embodiment is useful for cases in which it is difficult to wet etch the metal stack in the presence of photoresist.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, comprising the steps of:
    forming a first interlevel dielectric over a semiconductor body;
    forming a layer of resistor material over said first interlevel dielectric layer;
    forming a metal stack on said layer of resistor material;
    forming a first pattern aver said metal stack;
    etching said metal stack and said layer of resistor material using said first pattern to form a plurality of metal lines and a thin film resistor, wherein said metal lines are physically separated from said thin film resistor;
    removing said first pattern;
    forming a second pattern to expose a portion of said metal stack over said thin film resistor;
    removing said exposed portion of said metal stack.

2. The method of claim 1, wherein said second pattern is a photoresist pattern.

3. The method of claim 1, wherein said second pattern is a hardmask.

4. The method of claim 3, wherein said step of forming said second pattern comprises the steps of:
    forming a hardmask layer over said metal stack;
    forming a photoresist pattern over said hardmask layer to expose a portion of said hardmask layer over the thin film resistor area.;

removing said exposed portion of said hardmask layer; and removing said photoresist pattern.

5. The method of claim 4, wherein said hardmask layer comprises silicon dioxide.

6. The method of claim 1, wherein said interlevel dielectric layer comprises vias farmed at a surface thereof.

7. The method of claim 1, wherein B portion of said metal stack remains at a first end and a second end of said thin film resistor.

8. A method of fabricating an integrated circuit, comprising the steps of:

provinding a semiconductor body having a first interlevel dielectric layer;

forming a layer of resistor material over said first interlevel dielectric layer;

forming a metal stack on said layer of resistor material;

forming a first pattern over said metal stack, said first pattern covering said metal stack;

dry etching said metal stack and said layer of resistor material using said first pattern to form at least one metal line and a thin film resistor, wherein said at least one metal line is physically separated from said thin film resistor;

removing said first pattern;

forming a second pattern to expose a portion of said metal stack over said thin film resistor;

removing said exposed portion of said metal stack using a wet etch;

removing said second pattern; end forming a second interlevel dielectric layer over said at least one metal line and said thin film resistor.

9. The method of claim 8, wherein said second pattern is a photoresist pattern.

10. The method of claim 8, wherein said second pattern is a hardmask.

11. The method of claim 10, wherein said step of forming said second pattern comprises the steps of:

forming a hardmask layer over said metal stack;

forming a photoresist pattern over said hardmask layer to expose a portion of said hardmask layer over the thin film resistor area.;

removing said exposed portion of said hardmask layer; and removing said photoresist pattern.

12. The method of claim 8, wherein said first interlevel dielectric layer comprises vias formed at a surface thereof.

13. The method of claim 8, wherein a portion of said metal stack remains at a first end and a second end of said thin film resistor.

* * * * *